(12) United States Patent
Weekamp et al.

(10) Patent No.: US 8,330,332 B2
(45) Date of Patent: Dec. 11, 2012

(54) ULTRASOUND TRANSDUCER FEATURING A PITCH INDEPENDENT INTERPOSER AND METHOD OF MAKING THE SAME

(75) Inventors: Johannes W. Weekamp, Beek en Donk (NL); Samuel R. Peters, Burnham, PA (US); Richard E. Davidsen, Andover, MA (US); Wojtek Sudol, Andover, MA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 860 days.

(21) Appl. No.: 12/446,036

(22) PCT Filed: Jul. 20, 2007

(86) PCT No.: PCT/IB2007/052905
§ 371 (c)(1),
(2), (4) Date: Apr. 17, 2009

(87) PCT Pub. No.: WO2008/012748
PCT Pub. Date: Jan. 31, 2008

(65) Prior Publication Data
US 2010/0156243 A1 Jun. 24, 2010

Related U.S. Application Data

(60) Provisional application No. 60/820,184, filed on Jul. 24, 2006.

(51) Int. Cl.
*H01L 41/00* (2006.01)
(52) U.S. Cl. .......................................... 310/334

(58) Field of Classification Search .................. 310/334, 310/328, 311, 331, 327; 367/155, 157; 600/437, 600/459; *H01L 41/00*
See application file for complete search history.

(56) References Cited

U.S. PATENT DOCUMENTS
5,267,221 A 11/1993 Miller et al.
(Continued)

FOREIGN PATENT DOCUMENTS
DE 4142372 A1 6/1993
(Continued)

*Primary Examiner* — Thomas Dougherty
*Assistant Examiner* — Karen B Addison
(74) *Attorney, Agent, or Firm* — W. Brinton Yorks, Jr.

(57) ABSTRACT

An ultrasound transducer (10) comprises an application specific integrated circuit (ASIC) (14), an array of acoustic elements (20), and a pitch independent interposer (12). The ASIC (14) includes a plurality of contact pads (16) on a surface of the ASIC that are separated from adjacent ones thereof by a first pitch. The acoustic elements (22) of the array (20) are separated from adjacent ones thereof by a second pitch. In addition, the pitch independent interposer (12) features a plurality of conductive elements (26) separated from adjacent ones thereof by a third pitch different from both the first pitch and the second pitch. The pitch independent interposer (26) is electrically coupled (i) on a first side to the ASIC via a first subset of the plurality of conductive elements and (ii) on a second side to the array of acoustic elements via a second subset of the plurality of conductive elements, wherein one or more of the plurality of conductive elements (26) electrically couples a contact pad (16) of the ASIC (14) with a corresponding acoustic element (22) of the array (20) of acoustic elements.

11 Claims, 10 Drawing Sheets

U.S. PATENT DOCUMENTS

| | | |
|---|---|---|
| 5,329,498 A | 7/1994 | Greenstein |
| 5,648,942 A | 7/1997 | Kunkel, III |
| 7,557,489 B2 * | 7/2009 | Petersen et al. ............... 310/334 |
| 7,795,784 B2 * | 9/2010 | Davidsen et al. ............. 310/334 |
| 8,169,125 B2 * | 5/2012 | Savord et al. ................. 310/334 |
| 2003/0036702 A1 | 2/2003 | Davidsen |
| 2003/0085635 A1 | 5/2003 | Davidsen |
| 2003/0150273 A1 | 8/2003 | Ptchelintsev |
| 2005/0272183 A1 | 12/2005 | Lukacs et al. |

FOREIGN PATENT DOCUMENTS

| | | | |
|---|---|---|---|
| WO | 2003000337 A2 | | 1/2003 |
| WO | WO 03000337 | * | 1/2003 |

* cited by examiner

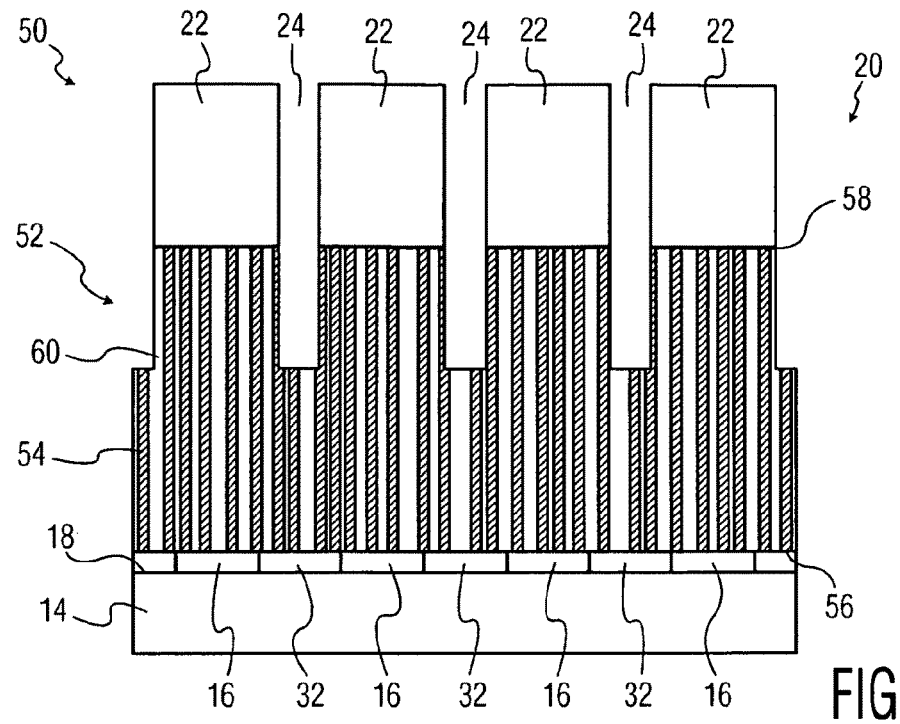
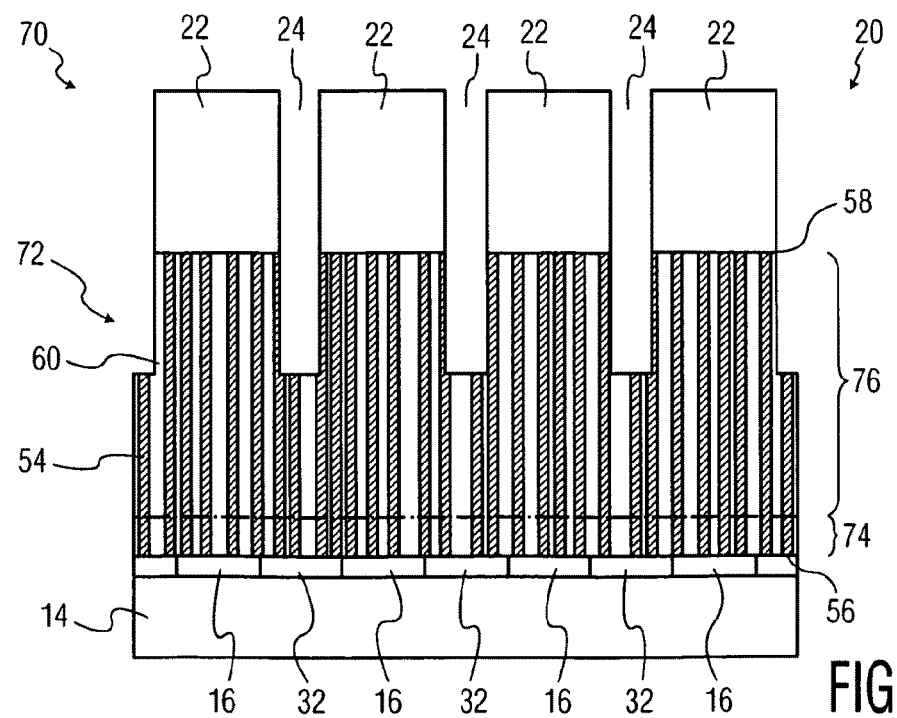

ULTRASOUND TRANSDUCER FEATURING A PITCH INDEPENDENT INTERPOSER AND METHOD OF MAKING THE SAME

The present embodiments relate generally to ultrasound systems and more particularly, to an ultrasound transducer featuring a pitch independent interposer and method of making the same.

In ultrasonic transducers that have acoustically active acoustic elements positioned directly on an integrated circuit (IC), the electrical interconnection between the elements and IC is generally facilitated by flip-chip techniques. This method of construction is useful in the fabrication of two-dimensional (2D) array transducers in which thousands of acoustic elements must be connected to the electronics of the IC. Flip-chip techniques typically include several steps, such as bumping, conductive adhesive printing, flip-chip attach and underfill. As 2D ultrasound transducers are starting to enjoy greater acceptance in the marketplace, there is a need to build much finer pitch devices and a need to lower the manufacturing cost of the same.

The flip-chip technique, however, has a pitch limitation of about one-hundred and twenty microns (120 μm) between contact pads on an ASIC. In addition, for 2D ultrasound transducers, there is a requirement for a significant separation between the IC and the acoustic stack (i.e., on the order of approximately 70-100 μm). The later mentioned separation is required in order to accommodate a dicing process that follows the flip-chip step. During the dicing process, the laminated acoustic stack is separated into individual elements.

The flip-chip technique also requires that the component parts to be coupled together be very flat (i.e., on the order of 6-10 μm maximum variation). Such a flatness requirement is difficult to achieve since both parts that are joined are laminates of thin layers of materials that have very different coefficients of thermal expansion. For large size transducers, assuring a necessary flatness can be very difficult.

The final step of the flip-chip technique is an underfill process, where a low viscosity epoxy is introduced into the gap between the parts. Capillary forces pull the epoxy into the gap which is on the order of between 70-100 μm. While such an underfill process works well for small size transducers, in large size transducers (on the order of 50 mm$^2$ and above) there is a significant risk that there will be trapped air bubbles. Trapped air bubbles can disadvantageously lead to catastrophic failure during a subsequent dicing process. Furthermore, as the flip-chip technique consists of several steps (bumping, conductive adhesive printing, flip-chip attach (including curing) and underfill (including curing), such a multi-step process translates to high manufacturing cost.

In addition to the above discussion, interposers provide benefits that allow one ASIC design to be used for several ultrasound transducer products with differing array pitches, thereby reducing development costs and risk while improving a time to market. Interposers also provide a thermal separation between the acoustic part and the ASIC (or ASICs) that generate a majority of the heat during an operation mode thereof. Interposers also allow configurations wherein the ASIC surface is larger than the array surface area, a situation that exists for high frequency arrays that have very tight pitches. Finally, curved interposers allow curved arrays to be built using flat ASICs. However, interposers that are "pitch matched" in that there is a single wire connecting respective contact pads on top and bottom surfaces of the ASIC and acoustic stack, respectively, are difficult to manufacture, while maintaining a high level of control on the location of the individual wires.

Accordingly, an improved method and system for overcoming the problems in the art is desired.

FIG. 3 is a cross-sectional view of an ultrasound transducer featuring a pitch independent interposer according to yet another embodiment of the present disclosure;

FIG. 4 is a cross-sectional view of an ultrasound transducer featuring a pitch independent interposer according to yet another embodiment of the present disclosure;

Figure 13:
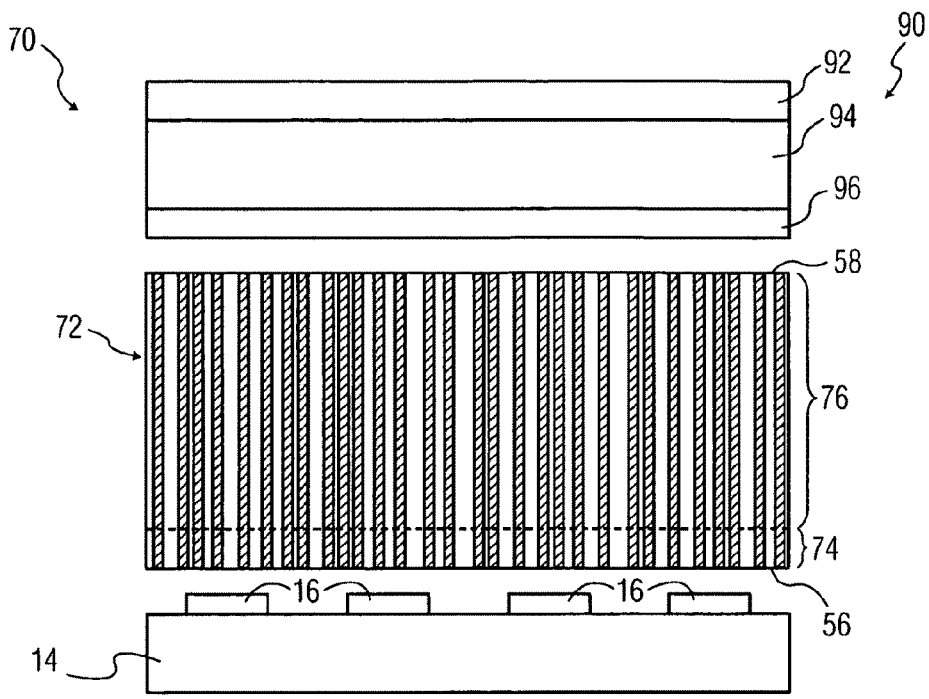
FIG. 13 is a cross-sectional view of an application specific integrated circuit (ASIC), a pitch independent interposer, and an acoustic stack for use in a process of making an ultrasound transducer according to another embodiment of the present disclosure.
Figure 14:
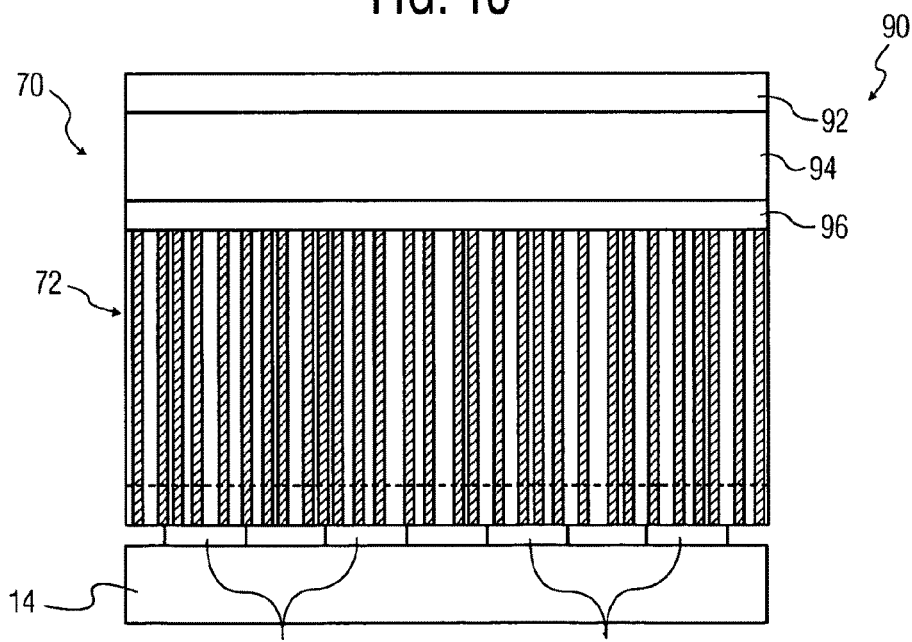
Figure 15:
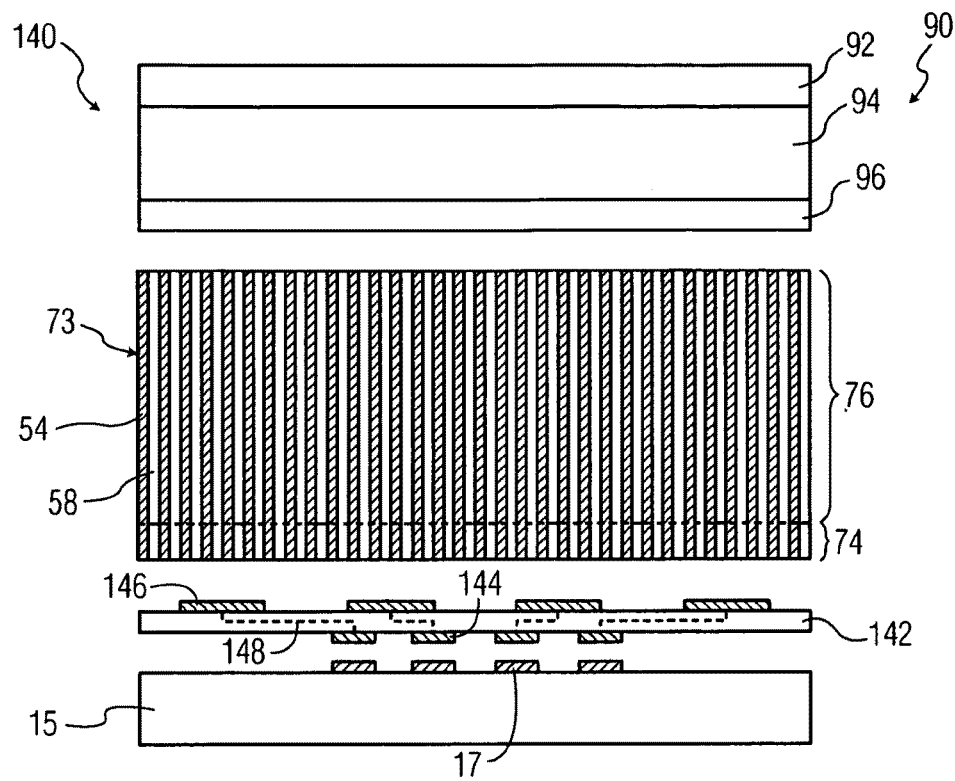
Figure 16:
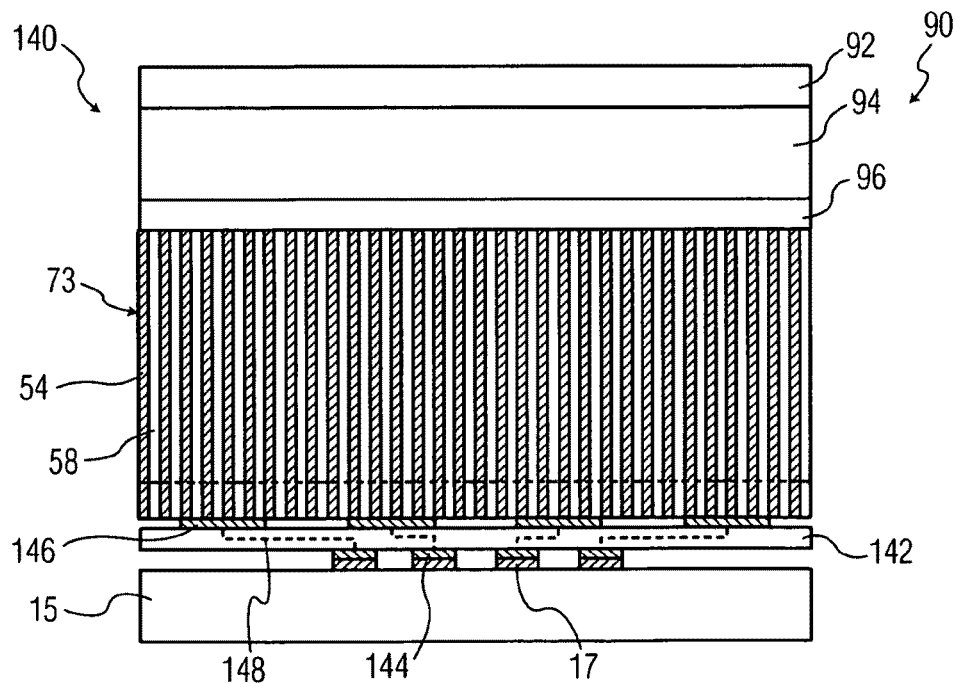
Figure 17:
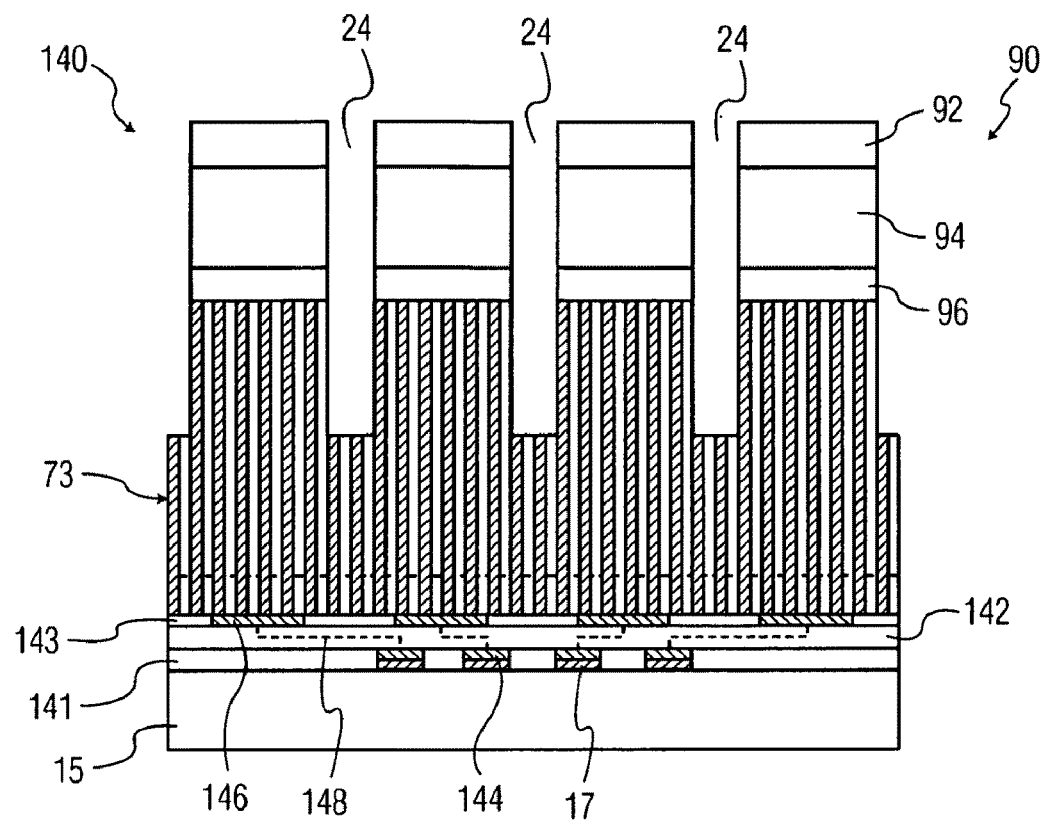
Figure 18:
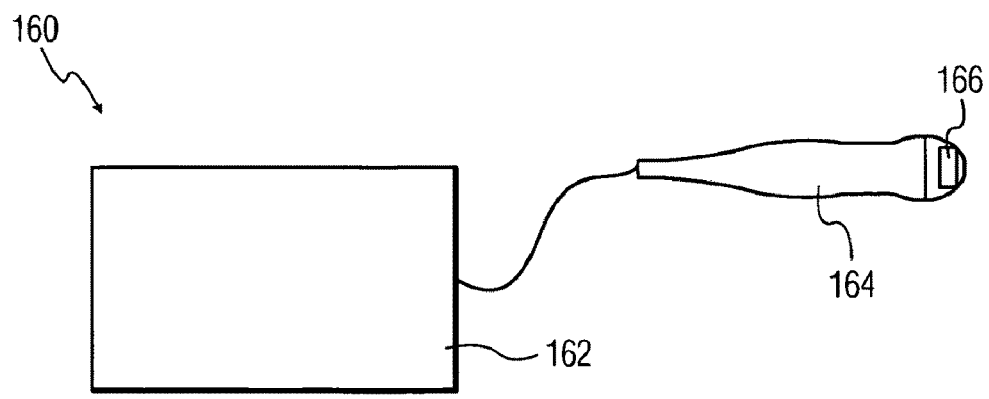

FIG. 14 is a cross-sectional view of the ASIC, the pitch independent interposer, and the acoustic stack of FIG. 13 in a subsequent step in the process of making an ultrasound transducer according to another embodiment of the present disclosure; and FIG. 15 is a cross-sectional view of an application specific integrated circuit (ASIC), a rerouting flex, a pitch independent interposer, and an acoustic stack for use in a process of making an ultrasound transducer according to one embodiment of the present disclosure;

FIG. 16 is a cross-sectional view of the ASIC, the rerouting flex, the pitch independent interposer, and the acoustic stack of FIG. 15 in a subsequent step in the process of making an ultrasound transducer according to one embodiment of the present disclosure;

FIG. 17 is a cross-sectional view of an ultrasound transducer featuring a pitch independent interposer formed from the elements of FIG. 16 according to another embodiment of the present disclosure;

FIG. 18 is a simplified block diagram view of an ultrasound imaging system with an ultrasound transducer featuring a pitch independent interposer according to an embodiment of the present disclosure.

In the figures, like reference numerals refer to like elements. In addition, it is to be noted that the figures may not be drawn to scale.

In one embodiment, the method of making the ultrasound transducer featuring a pitch independent interposer replaces the multiple step flip-chip technique with a single step process. The method of making such an ultrasound transducer enables producing finer pitch transducers (on the order of 100 μm or less), has lower flatness requirements (wherein a bonding process flattens the parts), and is low cost. As a result, the method also enables achieving finer pitches and lower manufacturing costs for such an ultrasound transducer.

Figure 1:
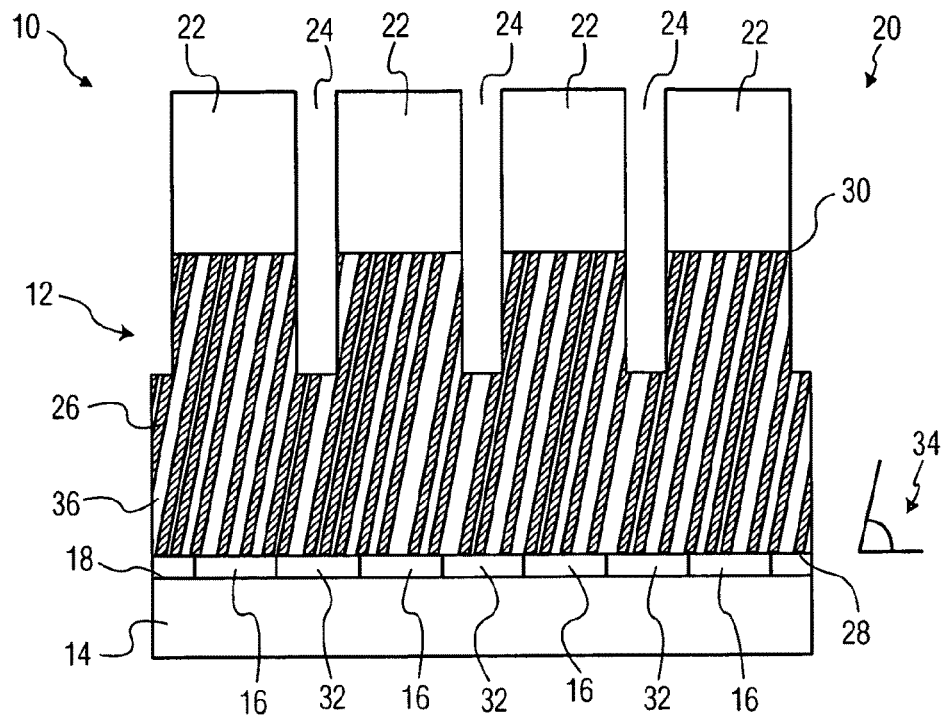
FIG. 1 is a cross-sectional view of an ultrasound transducer featuring a pitch independent interposer according to an embodiment of the present disclosure.

FIG. 1 is a cross-sectional view of an ultrasound transducer 10 featuring a pitch independent interposer 12 according to an embodiment of the present disclosure. Ultrasound transducer 10 comprises an application specific integrated circuit (ASIC) 14 having a plurality of contact pads 16 on a surface 18 of the ASIC 14. Contact pads 16 are separated from adjacent ones thereof by a first pitch. In one embodiment, ASIC 14 comprises a microbeamformer integrated circuit. Ultrasound transducer 10 further includes a two-dimensional array 20 of acoustic elements 22 separated from adjacent ones thereof by a second pitch. In this embodiment, the pitch of the contact pads on the ASIC and a corresponding pitch of the array of acoustic elements are the same (i.e., equal). Dicing channels 24 are disposed inbetween adjacent acoustic elements 22.

Pitch independent interposer 12 features a plurality of conductive elements 26. The conductive elements 26 are separated from adjacent ones thereof by a third pitch, wherein the third pitch is different from both the first pitch and the second pitch. The pitch independent interposer 12 is electrically coupled on a first side 28 to the ASIC 14 via a first subset of the plurality of conductive elements 26. Pitch independent interposer 12 is electrically coupled on a second side 30 to the two-dimensional array 20 of acoustic elements 22 via a second subset of the plurality of conductive elements 26. The region between adjacent contact pads 16, the surface of the ASIC 14, and the first side 28 of interposer 12, denoted by reference numeral 32, comprises a suitable underfill material.

In addition, one or more of the plurality of conductive elements 26 electrically couples a contact pad 16 of the ASIC 14 with a corresponding acoustic element 22 of the two dimensional array 20 of acoustic elements. In other words, there can exist more than one conductive element 26 coupled between a contact pad 16 and a corresponding acoustic element 22. In addition, some conductive elements 26 coupled to a contact pad 16 may not be coupled to a corresponding acoustic element 22, due to the presence of the dicing channel 24, and vice versa. Furthermore, in the embodiment of FIG. 1, the first subset and the second subset of the plurality of conductive elements 26 comprise different subsets.

In the embodiment of FIG. 1, the third pitch comprises a random pitch between adjacent conductive elements 26. For example, the third pitch can comprise a pitch on the order of fifty percent or less than either of the first pitch or the second pitch. In one embodiment, the third pitch comprises a random pitch. In another embodiment, the third pitch comprises a substantially constant pitch (not shown). In yet another embodiment, the third pitch comprises a given pitch, such that the given pitch of wires inside the interposer is sufficiently dense that each contact pad of the ASIC and a corresponding transducer element will have at least one wire coupled there between. In addition, the plurality of conductive elements 26 is oriented at an angle, indicated by reference numeral 34, with respect to the first side 28. For example, the angle 34 can comprise an angle other than perpendicular.

The plurality of conductive elements is further disposed within a cured potting material 36. The cured potting material 36 can comprise, for example, one selected from the group consisting of a cured thermosetting epoxy and a cured thermoplastic polymer resin.

Figure 2:
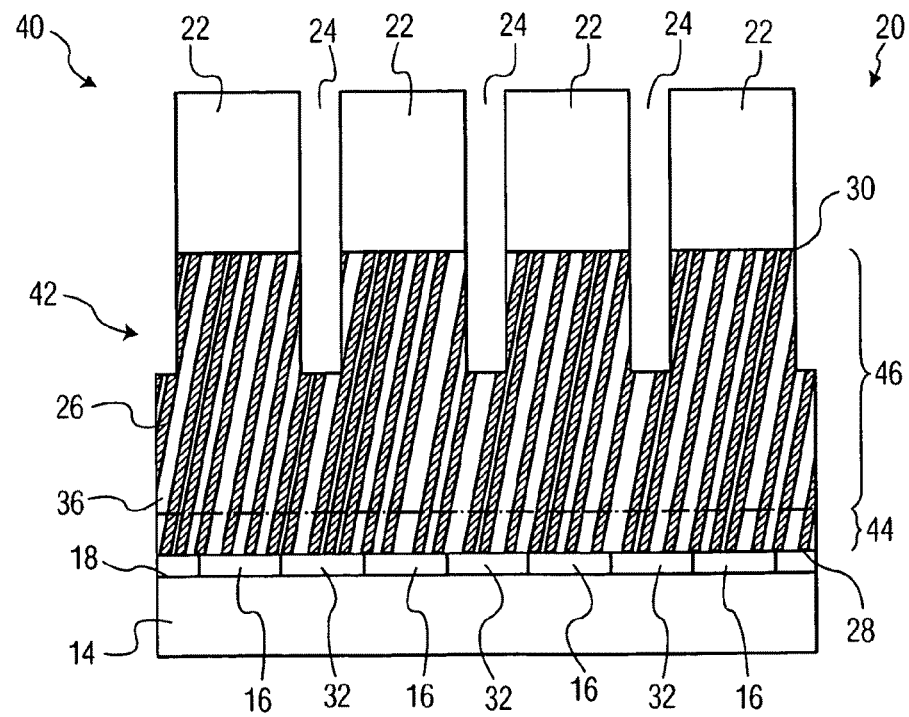
FIG. 2 is a cross-sectional view of an ultrasound transducer featuring a pitch independent interposer according to another embodiment of the present disclosure.

FIG. 2 is a cross-sectional view of an ultrasound transducer 40 featuring a pitch independent interposer 42 according to another embodiment of the present disclosure. The embodiment of FIG. 2 is similar to that of FIG. 1, with the following differences. The cured potting material 36 comprises a first region 44 and a second region 46. In region 44, proximate the first side 28 of interposer 42, the cured potting material 36 comprises a material having a coefficient of thermal expansion similar to a coefficient of thermal expansion of the ASIC 14. The potting material 36 of region 44 may comprise, for example, a highly mineral filled epoxy. Similar to that of the embodiment of FIG. 1, the potting material 36 of region 46 comprises, for example, one selected from the group consisting of a cured thermosetting epoxy and a cured thermoplastic polymer resin.

FIG. 3 is a cross-sectional view of an ultrasound transducer 50 featuring a pitch independent interposer 52 according to yet another embodiment of the present disclosure. The embodiment of FIG. 3 is similar to that of FIG. 1, with differences as discussed in the following. Pitch independent interposer 52 features a plurality of conductive elements 54. The conductive elements 54 are separated from adjacent ones thereof by a third pitch, wherein the third pitch is different from both the first pitch and the second pitch. The pitch independent interposer 52 is electrically coupled on a first side 56 to the ASIC 14 via a first subset of the plurality of conductive elements 54. Pitch independent interposer 52 is electrically coupled on a second side 58 to the two-dimensional array 20 of acoustic elements 22 via a second subset of the plurality of conductive elements 54. The region between adjacent contact pads 16, the surface of the ASIC 14, and the first side 28 of interposer 12, denoted by reference numeral 32, comprises a suitable underfill material.

In addition, one or more of the plurality of conductive elements 54 electrically couples a contact pad 16 of the ASIC 14 with a corresponding acoustic element 22 of the two dimensional array 20 of acoustic elements. In other words, there can exist more than one conductive element 54 coupled between a contact pad 16 and a corresponding acoustic element 22. Furthermore, in the embodiment of FIG. 3, the first subset and the second subset of the plurality of conductive elements 26 may comprise either the same subset or different subsets.

In the embodiment of FIG. 3, the third pitch comprises a random pitch between adjacent conductive elements 54. For example, the third pitch can comprise a pitch on the order of fifty percent or less than either of the first pitch or the second pitch. In one embodiment, the third pitch comprises a random pitch. In another embodiment, the third pitch comprises a substantially constant pitch, wherein the conductive elements are substantially equally spaced apart from one another, such as shown in FIGS. 15-17 and discussed herein. In addition, the plurality of conductive elements 54 is oriented generally perpendicular with respect to the first side 56. In another embodiment, the plurality of conductive elements 54 can be oriented at an angle other than perpendicular with respect to the first side 56.

The plurality of conductive elements 54 is further disposed within a laminated series of sheets of material 60, as will be discussed further herein below with reference to FIGS. 9-14. In one embodiment, the conductive elements are embedded within a laminated series of sheets of backing material.

FIG. 4 is a cross-sectional view of an ultrasound transducer 70 featuring a pitch independent interposer 72 according to yet another embodiment of the present disclosure. The embodiment of FIG. 4 is similar to that of FIG. 3, with the following differences. The laminated series of sheets of material 60 comprises a first region 74 and a second region 76. In region 74, proximate the first side 56 of interposer 72, the laminated series of sheets of material 60 comprises a material having a coefficient of thermal expansion similar to a coefficient of thermal expansion of the ASIC 14, as will be discussed further herein. Furthermore, in another embodiment, the pitch of the conductive elements 54 within interposer 72 can comprise a substantially constant pitch, wherein the conductive elements 54 are substantially equally spaced apart from one another, such as shown in FIGS. 15-17 and discussed herein.

Figure 5:
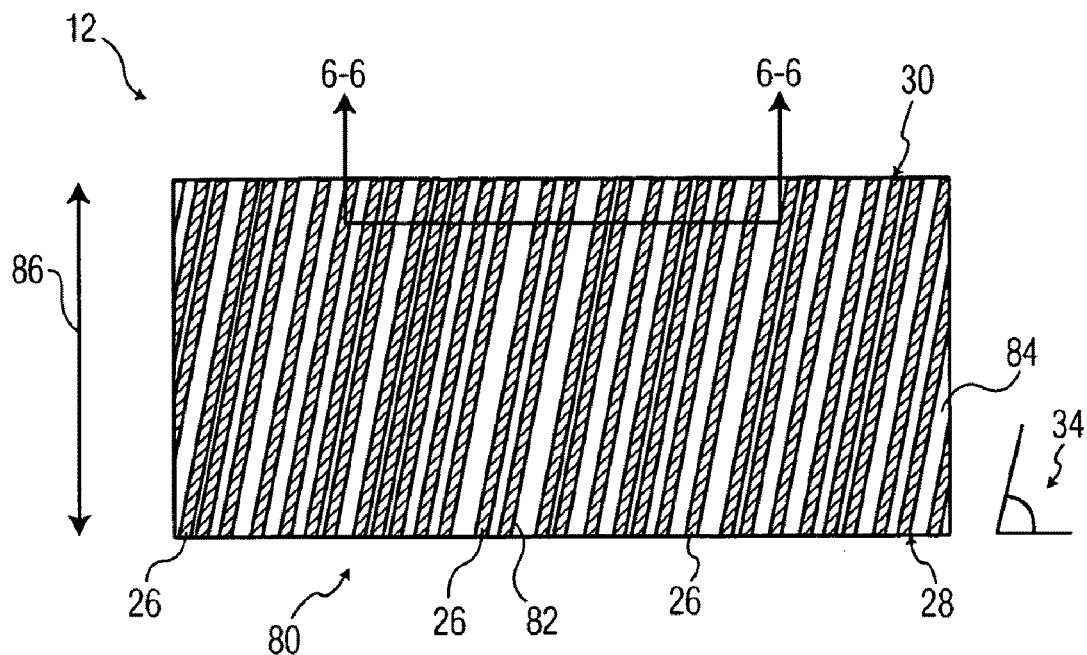
FIG. 5 is a cross-sectional view of a pitch independent interposer for use in the ultrasound transducer according to one embodiment of the present disclosure.
Figure 6:
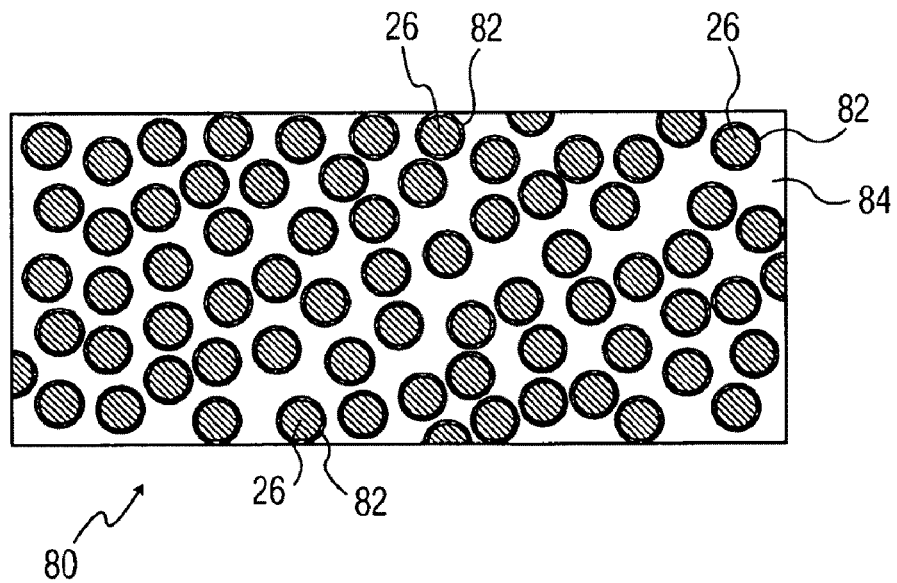
FIG. 6 is a horizontal-sectional view of a portion of the interposer of FIG. 5, taken along line 6-6, according to one embodiment of the present disclosure.

FIG. 5 is a cross-sectional view of a pitch independent interposer 12 for use in the ultrasound transducer according to one embodiment of the present disclosure. The interposer 12 comprises a plurality 80 of conductive elements 26. The conductive elements 26 include, for example, oriented fibers having a diameter on the order of approximately 8 μm and that have an isolating layer 82 on the order of approximately 1 μm thick produced on the fiber surface. In one embodiment, the fibers comprise nickel and the isolating layer 82 comprises nickel oxide. During a fabrication of the interposer 12, the bundle of fibers is potted in partially cured epoxy 84 (i.e., thermosetting epoxy) or alternatively is potted in thermoplastic polymer resin. Furthermore, in one embodiment, the fibers of the conductive elements 26 are oriented a slight angle 34 to a surface 28 of the interposer 12, wherein the slight angle of the fibers assists by pre-disposing the fibers to avoid buckling after bonding. In one embodiment, the thickness 86 of the interposer material is on the order of 100 μm. FIG. 6 is a horizontal-sectional view of a portion of the interposer 12 of FIG. 5, taken along line 6-6, according to one embodiment of the present disclosure. In the embodiment of FIG. 6, the third pitch between adjacent ones of the conductive elements 26 comprises a random pitch.

Figure 7:
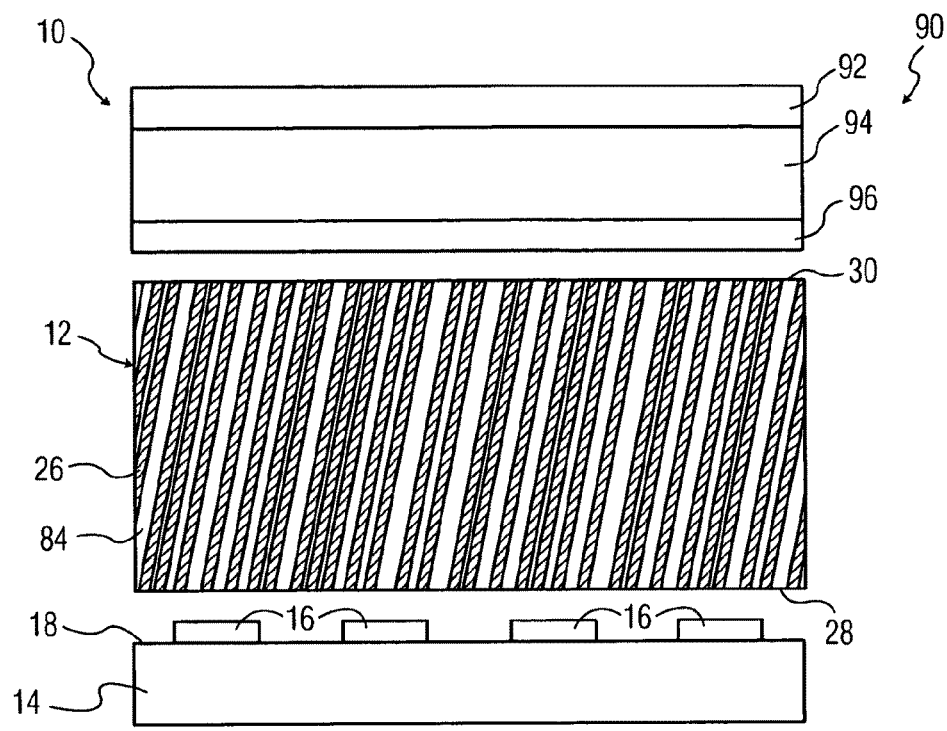
FIG. 7 is a cross-sectional view of an application specific integrated circuit (ASIC), a pitch independent interposer, and an acoustic stack for use in a process of making an ultrasound transducer according to one embodiment of the present disclosure.

FIG. 7 is a cross-sectional view of an application specific integrated circuit (ASIC) 12, a pitch independent interposer 12, and an acoustic stack 90 for use in a process of making an ultrasound transducer 10 according to one embodiment of the present disclosure. In particular, FIG. 7 illustrates a positioning of the components prior to bonding the same together. The acoustic stack 90 comprises, for example, a matching layer (ML) 92, piezo-electric layer 94 and dematching layer (DML) 96. The particular layers of acoustic stack 90 are selected according to the requirements of a given ultrasound transducer application. For example, in one embodiment, matching layer (ML) 92 can have a height dimension on the order of 120 microns, piezo-electric layer 94 can have a height dimension on the order of 120 microns and dematching layer (DML) 96 can have a height dimension on the order of 270 microns, wherein acoustic stack 90 has a height dimension on the order of 510 microns.

Figure 8:
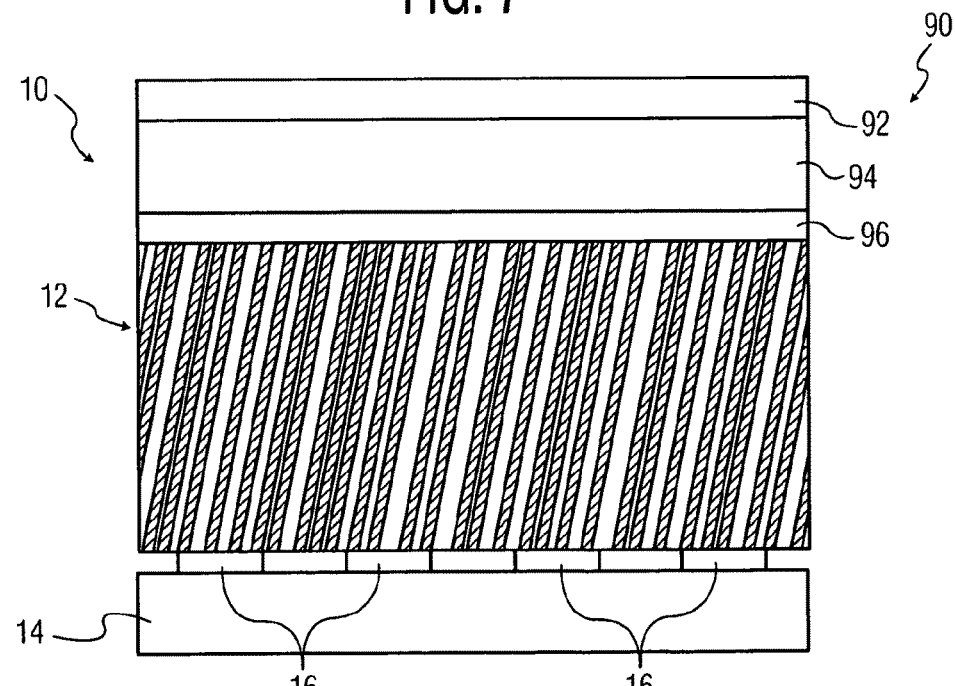
FIG. 8 is a cross-sectional view of the ASIC, the pitch independent interposer, and the acoustic stack of FIG. 7 in a subsequent step in the process of making an ultrasound transducer according to one embodiment of the present disclosure.

FIG. 8 is a cross-sectional view of the ASIC 14, the pitch independent interposer 12, and the acoustic stack 90 of FIG. 7 in a subsequent step in the process of making an ultrasound transducer according to one embodiment of the present disclosure. In particular, the parts are aligned, placed, and bonded together using a pressure and thermal treatment. Pressure flattens the parts together, while the thermal treatment cures the partially cured epoxy of the filler material. Subsequent to bonding the IC, interposer, and acoustic stack together, a suitable underfill material is used to fill the gap between the interposer and the IC. Subsequently, the acoustic stack 90 and a portion of interposer 12 are diced using a suitable dicing operation for creating an array of individual acoustic elements 22 from the acoustic stack, as shown in FIG. 1. In one embodiment, the array 20 comprises a two-dimensional array of acoustic elements 22.

The method of making the ultrasound transducer 40 of FIG. 2 is similar to the process of making the ultrasound transducer 10 of FIG. 1, with the exception that the bundle of fibers is potted in partially cured material 84, wherein the partially cured epoxy includes a first region 44 and a second region 46. In region 44, proximate the first side 28 of interposer 42, the partially cured potting material 84 comprises a material having a coefficient of thermal expansion similar to a coefficient of thermal expansion of the ASIC 14. The potting material 84 of region 44 may comprise, for example, epoxy with Silica fillers. Similar to that of the embodiment of FIG. 1, the partially cured material 84 of region 46 comprises, for example, one selected from the group consisting of a partially-cured thermosetting epoxy and a partially-cured thermoplastic polymer resin.

Figure 9:
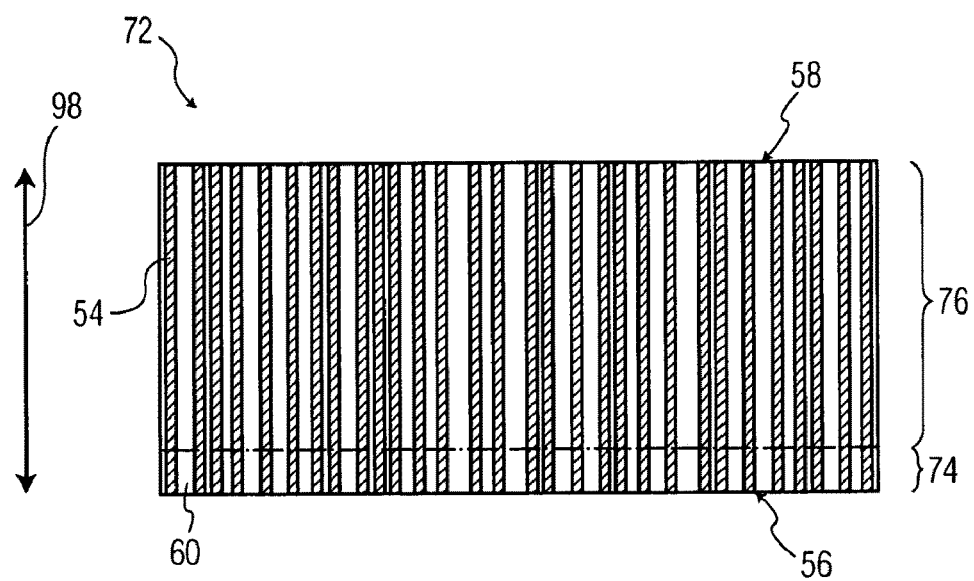
FIG. 9 is a cross-sectional view of a pitch independent interposer for use in the ultrasound transducer according to another embodiment of the present disclosure.

FIG. 9 is a cross-sectional view of a pitch independent interposer 72 for use in the ultrasound transducer according to another embodiment of the present disclosure. In particular, the plurality of conductive elements 60 is disposed within a laminated series of sheets of material 60. In one embodiment, the conductive elements 54 are embedded within a laminated series of sheets of backing material 60, as illustrated in FIG. 3. Backing material 60 comprises any suitable backing material for attenuating acoustic energy, selected according to the requirements of a particular ultrasound transducer application. In another embodiment, proximate the first side or surface 56, the sheets of material 60 can comprise a first portion 74 having a coefficient of thermal expansion similar to a coefficient of thermal expansion of the ASIC. The second portion 76 comprises backing material alone. Upon a completion of fabrication of interposer 72 it has a height dimension, for example, as illustrated by reference numeral 98.

Figure 10:
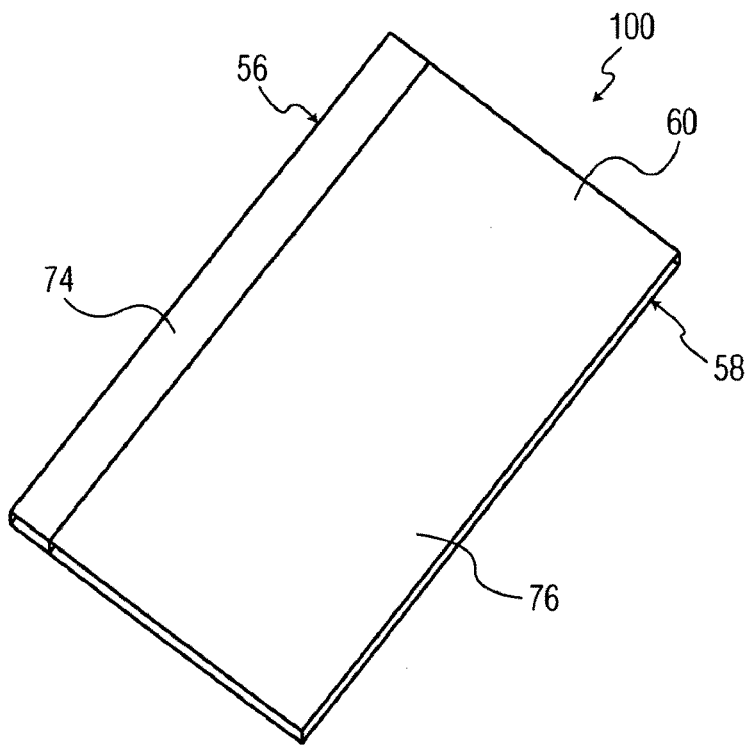
FIG. 10 is a three-dimensional view of a fabrication sheet, having a first portion of low coefficient of thermal expansion (CTE) material and a second portion of a backing material, for use in a process of making an ultrasound transducer featuring a pitch independent interposer according to one embodiment of the present disclosure.

FIG. 10 is a three-dimensional view of a fabrication sheet 100, having a first portion 74 of low coefficient of thermal expansion (CTE) material and a second portion 76 of a backing material, for use in a process of making an ultrasound transducer featuring a pitch independent interposer according to one embodiment of the present disclosure. In one embodiment, each sheet is fabricated by a process of wire dicing a stack of Low CTE material and backing material into slices. In one embodiment, the Low CTE material comprises low CTE moulding compound. Accordingly, each layer of the stack of layers in the formation of the interposer comprises a region or zone of Low CTE material at the ASIC side and backing material at the acoustic stack side.

Figure 11:
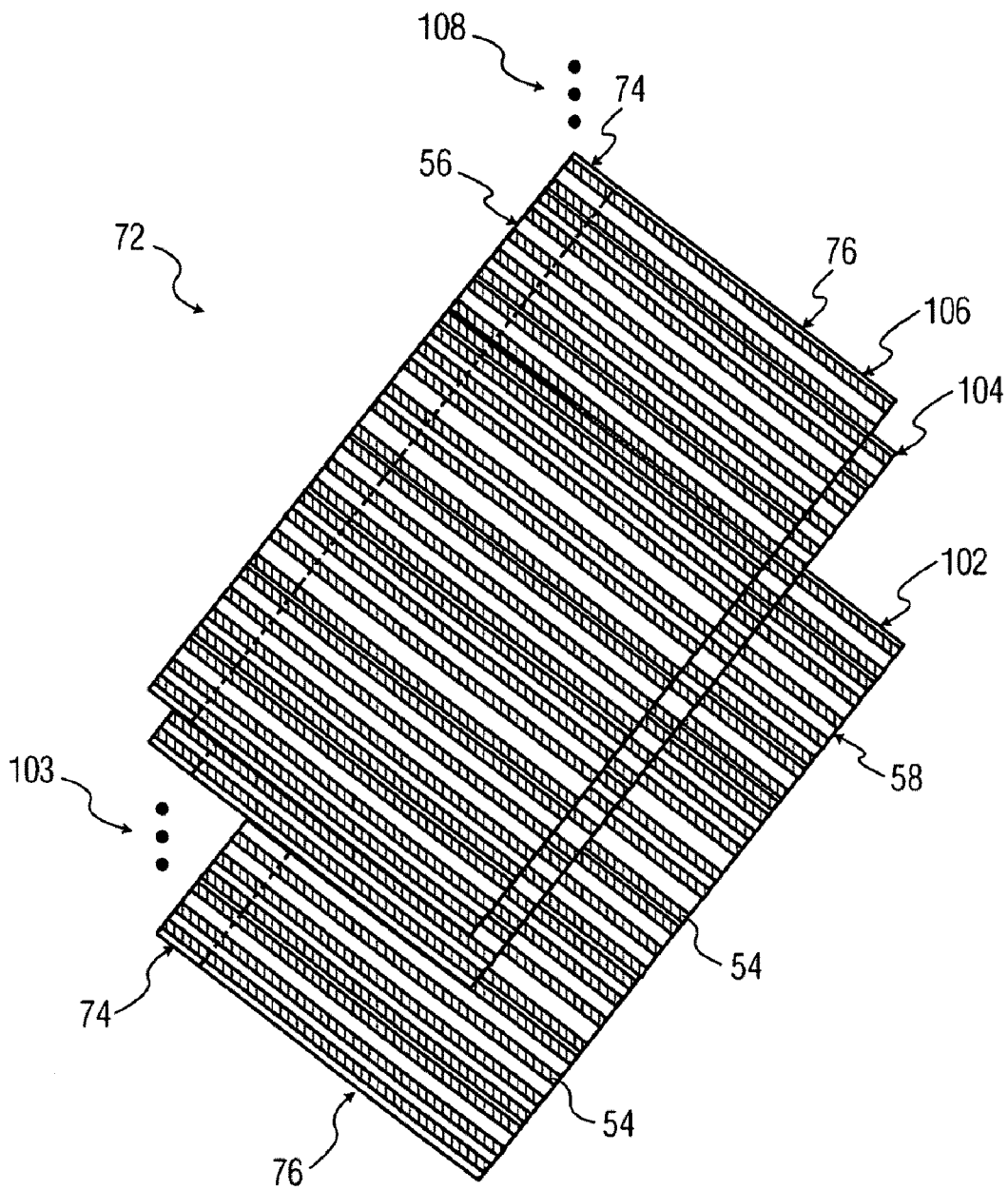
FIG. 11 is an exploded three-dimensional view of a number of pitch independent interposer sheets in the process of making an ultrasound transducer featuring a pitch independent interposer according to one embodiment of the present disclosure.

FIG. 11 is an exploded three-dimensional view of a number of pitch independent interposer sheets 100 in the process of making an ultrasound transducer featuring a pitch independent interposer according to one embodiment of the present disclosure. Fabrication of the interposer begins with a first sheet 102 and the formation of conductive elements 54 thereon. In one embodiment, the conductive elements comprise wires, as will be discussed further herein with respect to FIG. 12. Additional sheets with conductive elements are laminated over the previously placed sheet, for example, as illustrated by reference numeral 103 and sheets 104 and 106. The process continues, as indicated by reference numeral 108, until a desired thickness of the stack of laminated layers is achieved according to the requirements for a given ultrasound transducer application.

Figure 12:
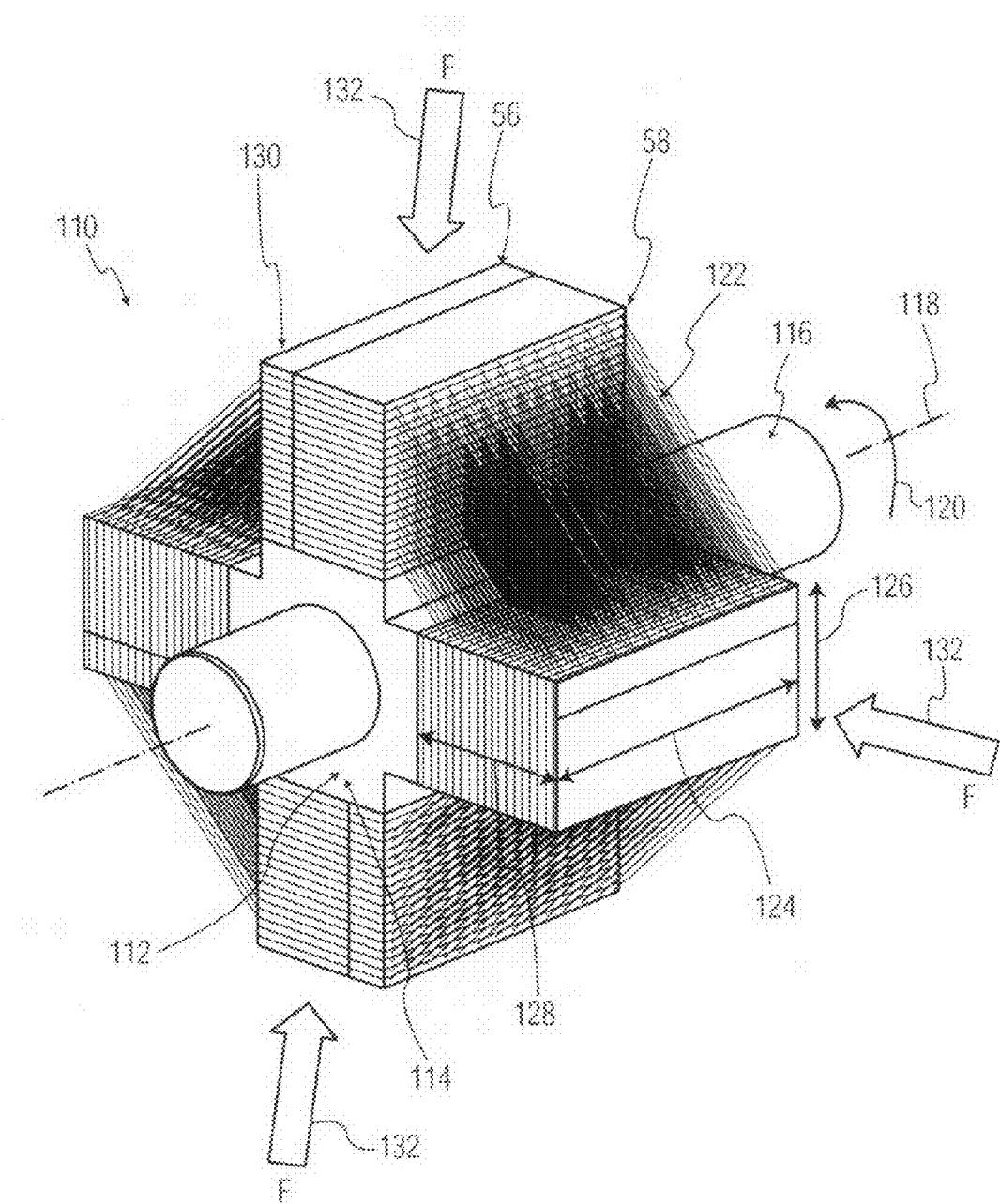
FIG. 12 is a three-dimensional view of mandrel and pitch independent interposer sheets in the process of making an ultrasound transducer featuring a pitch independent interposer according to one embodiment of the present disclosure.

FIG. 12 is a plan view of mandrel 110 and pitch independent interposer sheets 100 in the process of making an ultrasound transducer featuring a pitch independent interposer according to one embodiment of the present disclosure. Mandrel 110 comprises a base 112 having a number of surfaces, indicated by reference numeral 114, upon which the series of sheets 100 are stacked during a given part of the fabrication process for making the interposer. In one embodiment, the mandrel base 112 has four surfaces 114, upon which four series of stacked sheets can be fabricated at the same time.

The mandrel is further characterized by a shaft 116, having a principal axis 118, about which the mandrel can be rotated, for example as illustrated by reference numeral 120. To begin the process, a first sheet is placed upon each surface 114 of the mandrel. Wire 122, selected according to the requirements of a given ultrasound transducer implementation, is wound around the outer surfaces and along a width dimension 124 of each sheet. Portions of wire span a respective sheet from a first edge or surface 56 to a second edge or surface 58, corresponding to a length 126 of a respective sheet, along the width dimension 124.

After a first row in the series of sheets of the laminated structure has been fabricated, the process is repeated with a second and thereafter with additional sheets and wire until a desired thickness of a corresponding stack 130, generally indicated by reference numeral 128, is achieved. During the process of fabricating the series of layers 130 of sheets 100 and wire 60, a force (generally indicated by reference numeral 132) is applied after all desired layers are stacked. This is done at elevated temperature to facilitate a bonding and/or curing of the same. In addition, the wires have a self-bonding coating which is activated with temperature. Subsequent to this curing step, the four blocks can be removed from the mandrel without delaminating or falling apart.

In addition, the pitch of the wires located in-between successive layers of the Low CTE/backing material sheet layers is such that the probability of at least two wires making contact with a corresponding contact pad of the ASIC and contact a corresponding acoustic element is highly likely. Furthermore, the side of the interposer having the Low CTE material will be coupled to the contact pads of the ASIC (e.g., with or without a rerouting flex, discussed further herein with reference to FIGS. 15-17), whereas the side of the interposer having the backing material alone will be coupled to the acoustic stack, which is subsequently diced into elements.

FIG. 13 is a cross-sectional view of an application specific integrated circuit (ASIC) 12, a pitch independent interposer 72, and an acoustic stack 90 for use in a process of making an ultrasound transducer 70 (shown completed in FIG. 4) according to another embodiment of the present disclosure. In particular, FIG. 13 illustrates a positioning of the components prior to bonding the same together. The acoustic stack 90 comprises, for example, a matching layer (ML) 92, piezoelectric layer 94 and dematching layer (DML) 96, however, the particular layers of acoustic stack 90 are selected according to the requirements of a given ultrasound transducer application.

FIG. 14 is a cross-sectional view of the ASIC 14, the pitch independent interposer 72, and the acoustic stack 90 of FIG. 13 in a subsequent step in the process of making an ultrasound transducer according to another embodiment of the present disclosure. In particular, the parts are aligned, placed, and bonded together using flip-chip process. Subsequent to bonding the IC, interposer, and acoustic stack together, a suitable underfill material is used to fill the gap between the interposer and the IC. Subsequently, the acoustic stack 90 and a portion of interposer 72 are diced using a suitable dicing operation for creating an array of individual acoustic elements 22 from the acoustic stack, as shown in FIG. 4. In one embodiment, the array 20 comprises a two-dimensional array of acoustic elements 22.

Referring again briefly to FIG. 3, the method of making the ultrasound transducer 50 of FIG. 3 is similar to the process of making the ultrasound transducer 70 of FIG. 4, with the exception that in FIG. 3 the interposer 52 comprises backing material 60 without the portion of low CTE material proximate the first side 56.

Turning now to FIG. 15, the figure contains cross-sectional views of an application specific integrated circuit (ASIC) 15, a rerouting flex 142, a pitch independent interposer 73, and an acoustic stack 90 for use in a process of making an ultrasound transducer 140 according to another embodiment of the present disclosure. Fabrication of ultrasound transducer 140 is similar to that as described with respect to the earlier embodiments, with the following differences. In particular, ultrasound transducer 140 includes a rerouting flex 142, wherein the rerouting flex 142 can comprise signal rerouting at one or both surfaces thereof to accommodate a pitch change between the contact pads on the ASIC and the acoustic elements. In addition, the rerouting flex 142 comprises any suitable rerouting flex for providing a desired rerouting. For example, rerouting flex 142 may include a multilayer flex circuit, a multilayer printed circuit board, a multilayer co-fired ceramic, or multilayer silicon based rerouting circuit. In other words, ASIC 15 includes contact pads 17 on a top surface thereof. The rerouting flex 142 includes pads 144 on a lower surface thereof, which are pitch matched to the contact pads 17 of the ASIC 15. In addition rerouting flex 142 includes contact pads 146 on an upper surface thereof, which are pitch matched to the corresponding acoustic elements, yet to be formed. Rerouting conductive elements 148 are disposed within rerouting flex 142 as appropriate for providing a desired rerouting between contact pads of a first pitch to contact pads of a second pitch.

FIG. 16 is a cross-sectional view of the ASIC 15, the rerouting flex 142, the pitch independent interposer 73, and the acoustic stack 90 of FIG. 15 in a subsequent step in the process of making an ultrasound transducer according to one embodiment of the present disclosure. FIG. 17 is a cross-sectional view of the ultrasound transducer 140 featuring a pitch independent interposer formed from the elements of FIG. 16 according to another embodiment of the present disclosure. Appropriate underfill 141 and 145 are provided between respective portions of the ASIC 15, rerouting flex 142, and interposer 73.

According to one embodiment of the present disclosure, problems in the art are overcome by using densely packed wires (or conductive elements) that are perpendicular to the array surface. In addition, the perpendicular, densely packed wires require no particular alignment (i.e., of the wires to the array elements) be performed during a manufacturing of the ultrasound transducer according to the embodiments of the present disclosure. Rather, subsequent to defining the pads on the top and bottom surfaces of the ASIC and acoustic stack, respectively, the density of wires is made sufficiently dense so as to guarantee at least one wire of the plurality of wires will connect each set of corresponding pads.

FIG. 18 is a simplified block diagram view of an ultrasound imaging system 160 with an ultrasound transducer featuring a pitch independent interposer according to an embodiment of the present disclosure. Ultrasound diagnostic imaging system 160 includes a base unit 162 adapted for use with ultrasound transducer probe 164. Ultrasound transducer probe 164 includes ultrasound transducer 166 as discussed herein. That is, ultrasound transducer 166 can comprise any one of the transducers 10, 40, 50, 70, or 140, as discussed herein. Base unit 162 includes suitable electronics for performing ultrasound diagnostic imaging according to the requirements of a particular ultrasound diagnostic application. Ultrasound transducer probe 164 couples to base unit 162 via a suitable connection, for example, an electronic cable, a wireless connection, or other suitable means. Ultrasound diagnostic imaging system 160 can be used for performing various types of medical diagnostic ultrasound imaging or other non-destructive testing applications.

According to one embodiment, an ultrasound transducer comprises an application specific integrated circuit (ASIC) having a plurality of contact pads on a surface of the ASIC that are separated from adjacent ones thereof by a first pitch, a two-dimensional array of acoustic elements separated from adjacent ones thereof by a second pitch, and a pitch independent interposer featuring a plurality of conductive elements. The conductive elements are separated from adjacent ones thereof by a third pitch different from both the first pitch and the second pitch. In addition, the pitch independent interposer is electrically coupled (i) on a first side to the ASIC via a first subset of the plurality of conductive elements and (ii) on a second side to the two dimensional array of acoustic elements via a second subset of the plurality of conductive elements, wherein one or more of the plurality of conductive elements electrically couples a contact pad of the ASIC with a corresponding acoustic element of the two dimensional array of acoustic elements. In one embodiment, the first subset and the second subset of the plurality of conductive elements comprise the same subset. In another embodiment, the first subset and the second subset of the plurality of conductive elements comprise different subsets.

The third pitch can comprise a pitch selected from the group consisting of an ordered pitch between adjacent conductive elements and a random pitch between adjacent conductive elements. For example, the third pitch can comprise a pitch on the order of fifty percent or less than either of the first pitch or the second pitch.

In another embodiment, the plurality of conductive elements is oriented at an angle with respect to the first side. For example, the angle can comprise an angle other than perpendicular.

In a further embodiment, the plurality of conductive elements is disposed within a cured potting material. The cured potting material can comprise, for example, one selected from the group consisting of a cured thermosetting epoxy and a cured thermoplastic polymer resin. In another embodiment, proximate the first side, the cured potting material comprises a material having a coefficient of thermal expansion similar to a coefficient of thermal expansion of the ASIC.

In a yet further embodiment, the plurality of conductive elements is disposed within a laminated series of sheets of material. In one embodiment, the conductive elements are embedded within a laminated series of sheets of backing material. In another embodiment, proximate the first side, the sheets of material can comprise a first portion having a coefficient of thermal expansion similar to a coefficient of thermal expansion of the ASIC. In a further embodiment, the ASIC of the ultrasound transducer comprises a microbeamformer integrated circuit.

According to another embodiment, an ultrasound diagnostic imaging system is adapted for use with an ultrasound transducer as discussed herein. That is, the ultrasound transducer comprises an application specific integrated circuit (ASIC) having a plurality of contact pads on a surface of the ASIC that are separated from adjacent ones thereof by a first pitch. In addition, the ultrasound transducer includes a two-dimensional array of acoustic elements separated from adjacent ones thereof by a second pitch. Furthermore, the ultrasound transducer includes a pitch independent interposer featuring a plurality of conductive elements. The conductive elements of the plurality are separated from adjacent ones thereof by a third pitch different from both the first pitch and the second pitch. The pitch independent interposer is electrically coupled (i) on a first side to the ASIC via a first subset of the plurality of conductive elements and (ii) on a second side to the two dimensional array of acoustic elements via a second subset of the plurality of conductive elements, wherein one or more of the plurality of conductive elements electrically couples a contact pad of the ASIC with a corresponding acoustic element of the two dimensional array of acoustic elements.

In another embodiment of the present disclosure, a method of making an ultrasound transducer comprises coupling a pitch independent interposer on a first side to a plurality of contact pads on a surface of an application specific integrated circuit (ASIC), the plurality of contact pads being separated from adjacent ones thereof by a first pitch. In addition, the method includes coupling an acoustic stack to a second side of the pitch independent interposer. Furthermore, the method includes dicing the acoustic stack into an array of acoustic elements separated from adjacent ones thereof by a second pitch. Moreover, the conductive elements of the pitch independent interposer are separated from adjacent ones thereof by a third pitch different from both the first pitch and the second pitch. As a result, the pitch independent interposer electrically couples (i) on the first side thereof to the ASIC via a first subset of the plurality of conductive elements and (ii) on the second side thereof to the array of acoustic elements via a second subset of the plurality of conductive elements, wherein one or more of the plurality of conductive elements electrically couples a contact pad of the ASIC with a corresponding acoustic element of the array of acoustic elements. In one embodiment, the first subset and the second subset of the plurality of conductive elements comprise the same subset. In another embodiment, the first subset and the second subset of the plurality of conductive elements comprise different subsets.

The third pitch comprises one selected from the group consisting of an ordered pitch between adjacent conductive elements and a random pitch between adjacent conductive elements. For example, the third pitch can comprise a pitch selected on the order of fifty percent or less of either of the first pitch or the second pitch.

In another embodiment, the method further comprises forming the pitch independent interposer wherein the plurality of conductive elements is oriented at an angle with respect to the first side. For example, the angle can comprise an angle other than perpendicular.

In yet another embodiment, the method can further comprise forming the pitch independent interposer wherein the plurality of conductive element are disposed within a partially cured potting material, placing the pitch independent interposer overlying the ASIC, placing the acoustic stack overlying the pitch independent interposer, and pressing and thermally treating the combination of the acoustic stack, the pitch independent interposer, and the ASIC to electrically couple and physically bond the same together. The partially cured potting material can comprise, for example, one selected from the group consisting of a partially cured thermosetting epoxy and a partially cured thermoplastic polymer resin. In another embodiment, proximate the first side, the partially cured potting material comprises a material having a coefficient of thermal expansion similar to a coefficient of thermal expansion of the ASIC.

In another embodiment, the method can further comprise forming the pitch independent interposer by disposing the plurality of conductive elements within a series of laminated sheets of material, placing the pitch independent interposer overlying the ASIC, placing the acoustic stack overlying the pitch independent interposer, and bonding the combination of the acoustic stack, the pitch independent interposer, and the ASIC via flip-chip processing to electrically couple and physically bond the same together. In one embodiment, the conductive elements are embedded within the series of laminated sheets of backing material. Still further, proximate the first side, the sheets of material can comprise a first portion having a coefficient of thermal expansion similar to a coefficient of thermal expansion of the ASIC.

Although only a few exemplary embodiments have been described in detail above, those skilled in the art will readily appreciate that many modifications are possible in the exemplary embodiments without materially departing from the novel teachings and advantages of the embodiments of the present disclosure. For example, the embodiments of the present disclosure can be applied to any number of applications requiring the use of an ultrasound transducer, such as medical or other non-destructive testing applications. In addition, as used herein, acoustic elements can include any suitable elements for generation of ultrasound, including but not limited to single crystal acoustic elements, piezoceramic acoustic elements, micromachined ultrasound transducer acoustic elements, etc. Furthermore, while a two-dimensional array of acoustic elements has been disclosed with respect to the various embodiments herein, a one-dimensional array of acoustic elements could also be used. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

In addition, any reference signs placed in parentheses in one or more claims shall not be construed as limiting the claims. The word "comprising" and "comprises," and the like, does not exclude the presence of elements or steps other than those listed in any claim or the specification as a whole. The singular reference of an element does not exclude the plural references of such elements and vice-versa. One or more of the embodiments may be implemented by means of hardware comprising several distinct elements, and/or by means of a suitably programmed computer. In a device claim enumerating several means, several of these means may be embodied by one and the same item of hardware. The mere fact that certain measures are recited in mutually different dependent claims does not indicate that a combination of these measures cannot be used to an advantage.

The invention claimed is:

1. An ultrasound transducer comprising:
an application specific integrated circuit (ASIC) having a plurality of contact pads on a surface of the ASIC that are separated from adjacent ones thereof by a first pitch;
an array of acoustic elements separated from adjacent ones thereof by a second pitch; and
a pitch independent interposer featuring a plurality of conductive elements, wherein the plurality of conductive elements are separated from adjacent ones thereof by a third pitch different from both the first pitch and the second pitch, the pitch independent interposer being electrically coupled (i) on a first side to the ASIC via a first subset of the plurality of conductive elements and (ii) on a second side to the array of acoustic elements via a second subset of the plurality of conductive elements, wherein one or more of the plurality of conductive elements electrically couples a contact pad of the ASIC with a corresponding acoustic element of the array of acoustic elements,
further comprising:
a rerouting flex disposed in-between the ASIC and the pitch independent interposer, the rerouting flex configured for providing signal rerouting to accommodate a pitch change between the contact pads on the ASIC and the acoustic elements, wherein the rerouting flex includes pads on a lower surface thereof that are pitch matched to the contact pads of the ASIC of the first pitch and contact pads on an upper surface thereof that are pitch matched to the corresponding acoustic elements of the second pitch.

2. The ultrasound transducer of claim 1, further wherein the plurality of conductive elements is oriented at an angle with respect to the first side.

3. The ultrasound transducer of claim 2, wherein the angle comprises an angle other than perpendicular.

4. The ultrasound transducer of claim 1, further wherein the plurality of conductive elements is disposed within a laminated series of sheets of material.

5. The ultrasound transducer of claim 4, still further wherein the conductive elements are embedded within a laminated series of sheets of backing material.

6. The ultrasound transducer of claim 4, still further wherein proximate the first side, the sheets of material comprise a first portion having a coefficient of thermal expansion similar to a coefficient of thermal expansion of the ASIC.

7. An ultrasound transducer comprising:
an application specific integrated circuit (ASIC) having a plurality of contact pads on a surface of the ASIC that are separated from adjacent ones thereof by a first pitch;
an array of acoustic elements separated from adjacent ones thereof by a second pitch; and
a pitch independent interposer featuring a plurality of conductive elements, wherein the plurality of conductive elements are separated from adjacent ones thereof by a third pitch different from both the first pitch and the second pitch, the pitch independent interposer being electrically coupled (i) on a first side to the ASIC via a first subset of the plurality of conductive elements and (ii) on a second side to the array of acoustic elements via a second subset of the plurality of conductive elements, wherein one or more of the plurality of conductive elements electrically couples a contact pad of the ASIC with a corresponding acoustic element of the array of acoustic elements,
wherein the third pitch is on the order of fifty percent less than either of the first pitch or the second pitch.

8. An ultrasound transducer comprising:
an application specific integrated circuit (ASIC) having a plurality of contact pads on a surface of the ASIC that are separated from adjacent ones thereof by a first pitch;
an array of acoustic elements separated from adjacent ones thereof by a second pitch; and
a pitch independent interposer featuring a plurality of conductive elements, wherein the plurality of conductive elements are separated from adjacent ones thereof by a third pitch different from both the first pitch and the second pitch, the pitch independent interposer being electrically coupled (i) on a first side to the ASIC via a first subset of the plurality of conductive elements and (ii) on a second side to the array of acoustic elements via a second subset of the plurality of conductive elements, wherein one or more of the plurality of conductive elements electrically couples a contact pad of the ASIC with a corresponding acoustic element of the array of acoustic elements,
further wherein the plurality of conductive elements is disposed within a cured potting material.

9. The ultrasound transducer of claim 8, wherein the cured potting material comprises one selected from the group consisting of a cured thermosetting epoxy and a cured thermoplastic polymer resin.

10. The ultrasound transducer of claim 8, further wherein proximate the first side, the cured potting material comprises a material having a coefficient of thermal expansion similar to a coefficient of thermal expansion of the ASIC.

11. An ultrasound transducer comprising:
an application specific integrated circuit (ASIC) having a plurality of contact pads on a surface of the ASIC that are separated from adjacent ones thereof by a first pitch;
an array of acoustic elements separated from adjacent ones thereof by a second pitch; and
a pitch independent interposer featuring a plurality of conductive elements, wherein the plurality of conductive elements are separated from adjacent ones thereof by a third pitch different from both the first pitch and the second pitch, the pitch independent interposer being electrically coupled (i) on a first side to the ASIC via a first subset of the plurality of conductive elements and (ii) on a second side to the array of acoustic elements via a second subset of the plurality of conductive elements, wherein one or more of the plurality of conductive elements electrically couples a contact pad of the ASIC with a corresponding acoustic element of the array of acoustic elements,
wherein the ASIC comprises a microbeamformer integrated circuit.

\* \* \* \* \*